United States Patent
Jung

(10) Patent No.: US 10,635,517 B2
(45) Date of Patent: Apr. 28, 2020

(54) SEMICONDUCTOR DEVICES COMPARING ERROR CODES AND SEMICONDUCTOR SYSTEMS INCLUDING THE SAME

(71) Applicant: SK hynix Inc., Icheon-si Gyeonggi-do (KR)

(72) Inventor: Dong Ha Jung, Icheon-si (KR)

(73) Assignee: SK hynix Inc., Icheon-si Gyeonggi-do (KR)

(*) Notice: Subject to any disclaimer, the term of this patent is extended or adjusted under 35 U.S.C. 154(b) by 150 days.

(21) Appl. No.: 15/604,059

(22) Filed: May 24, 2017

(65) Prior Publication Data

US 2018/0136996 A1 May 17, 2018

(30) Foreign Application Priority Data

Nov. 16, 2016 (KR) .................. 10-2016-0152599

(51) Int. Cl.
| | | |
|---|---|---|
| G06F 11/00 | (2006.01) | |
| G06F 11/07 | (2006.01) | |
| G06F 11/10 | (2006.01) | |
| G11C 11/4096 | (2006.01) | |
| G11C 29/52 | (2006.01) | |
| G11C 5/04 | (2006.01) | |

(52) U.S. Cl.
CPC ........ *G06F 11/079* (2013.01); *G06F 11/0727* (2013.01); *G06F 11/0751* (2013.01); *G06F 11/0787* (2013.01); *G06F 11/1048* (2013.01); *G11C 11/4096* (2013.01); *G11C 29/52* (2013.01); *G11C 5/04* (2013.01)

(58) Field of Classification Search
CPC ................... G06F 11/1683; G06F 11/1004
See application file for complete search history.

(56) References Cited

U.S. PATENT DOCUMENTS

| | | | | |
|---|---|---|---|---|
| 5,630,054 | A * | 5/1997 | Trang ................. | G06F 11/1008 714/52 |
| 5,909,541 | A * | 6/1999 | Sampson ............ | G06F 11/1044 714/6.2 |
| 7,650,558 | B2 * | 1/2010 | Rosenbluth ......... | H03M 13/356 714/766 |
| 7,676,730 | B2 * | 3/2010 | Haugan ............... | G06F 11/1012 714/766 |

(Continued)

FOREIGN PATENT DOCUMENTS

KR 20140067819 A 6/2014

*Primary Examiner* — Christopher S McCarthy
(74) *Attorney, Agent, or Firm* — William Park & Associates Ltd.

(57) ABSTRACT

A semiconductor device and or system may be provided. The semiconductor system may include a first semiconductor device and a second semiconductor device. The first semiconductor device may be configured to output a command/address signal, a first datum and a second datum. The first semiconductor device may be configured to receive a comparison signal relating to the first datum and the second datum. The second semiconductor device may be configured to store a first error code of the first datum and a second error code of the second datum based on the command/address signal during a write operation. The second semiconductor device may be configured to compare the first error code with the second error code to output the comparison signal based on the command/address signal during a read operation.

18 Claims, 7 Drawing Sheets

(56) References Cited

U.S. PATENT DOCUMENTS

| | | | |
|---|---|---|---|
| 7,774,684 B2 * | 8/2010 | Bains | G06F 11/1008 |
| | | | 714/766 |
| 8,756,475 B2 * | 6/2014 | Chung | G06F 11/1008 |
| | | | 714/755 |
| 8,880,970 B2 * | 11/2014 | Gillingham | G06F 11/10 |
| | | | 714/748 |
| 9,239,752 B2 * | 1/2016 | Lee | G06F 11/1004 |
| 9,734,328 B2 * | 8/2017 | Barau | G06F 11/167 |
| 10,102,003 B2 * | 10/2018 | Swanberg | G06F 9/30098 |
| 10,152,374 B2 * | 12/2018 | Lea | G06F 12/00 |
| 2010/0332949 A1 | 12/2010 | d'Abreu et al. | |

* cited by examiner

SEMICONDUCTOR DEVICES COMPARING ERROR CODES AND SEMICONDUCTOR SYSTEMS INCLUDING THE SAME

CROSS-REFERENCE TO RELATED APPLICATIONS

The present application claims priority under 35 U.S.C. 119(a) to Korean Application No. 10-2016-0152599, filed on Nov. 16, 2016, which is incorporated herein by reference in its entirety.

BACKGROUND

1. Technical Field

Embodiments of the present disclosure may generally relate to semiconductor devices, and more particularly, to semiconductor devices and semiconductor systems related to the comparison of error codes to detect similarities between data.

2. Related Art

Recently, it has become more and more important to guarantee the reliability of semiconductor memory devices when the semiconductor memory devices consist of fine patterns having a width of about 10 nanometers or less and implement the use of fast interfaces such as DDR4 schemes. If data transmission speeds of the semiconductor memory devices increases, the probability of causing errors may increase while the data is transmitted within the semiconductor devices. Accordingly, novel design schemes may be required to guarantee the reliable transmission of the data.

Whenever the data is transmitted in semiconductor devices, error codes which are capable of detecting the occurrence of errors may be generated and transmitted with the data to improve the reliability of data transmission. The error codes may include an error detection code (EDC) which is capable of detecting errors and an error correction code (ECC) which is capable of correcting the errors by itself.

SUMMARY

According to an embodiment, a semiconductor device may be provided. According to an embodiment, a semiconductor system may be provided. The semiconductor system may include a first semiconductor device and a second semiconductor device. The first semiconductor device may be configured to output a command/address signal, a first datum and a second datum. The first semiconductor device may be configured to receive a comparison signal relating to the first datum and the second datum. The second semiconductor device may be configured to store a first error code of the first datum and a second error code of the second datum based on the command/address signal during a write operation. The second semiconductor device may be configured to compare the first error code with the second error code to output the comparison signal based on the command/address signal during a read operation. Wherein a number of bits in the first error code is less than a number of bits in the first datum, and wherein a number of bits in the second error code is less than a number of bits in the second datum.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
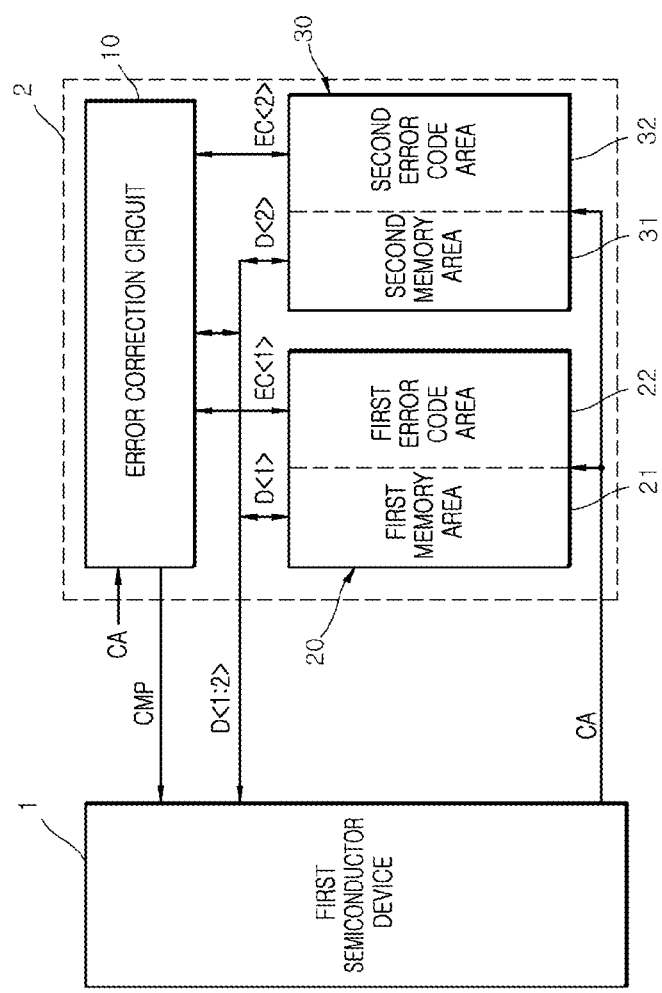
FIG. 1 is a block diagram illustrating a configuration of a semiconductor system according to an embodiment.

Referring to FIG. 1, a semiconductor system according to an embodiment may include a first semiconductor device 1 and a second semiconductor device 2. The second semiconductor device 2 may include an error correction circuit 10, a first bank 20 and a second bank 30.

The first semiconductor device 1 may output a command and address (command/address) signal CA, a first datum D<1> and a second datum D<2> (i.e., D<1:2>). The first semiconductor device 1 may receive a comparison signal CMP to detect identity between the first datum D<1> and the second datum D<2>. In an embodiment, for example, detecting an identity between the first datum D<1> and the second datum D<2> may mean detecting whether the logic level combination of the first datum D<1> is equal to or not equal to the logic level combination of the second datum D<2>. The command/address signal CA may be transmitted through a signal line that transmits at least one of an address, a command and data. The command/address signal CA may include a plurality of bits. One or more bits among the plurality of bits included in the command/address signal CA may include a command for controlling an operation of the second semiconductor device 2. One or more bits among the plurality of bits included in the command/address signal CA may include an address for selecting memory cells included in the first bank 20 and the second bank 30 of the second semiconductor device 2. Although the first datum D<1> is illustrated as a single signal line in FIG. 1, the first datum D<1> may include a plurality of bits. Similarly, although the second datum D<2> is illustrated as a single signal line in FIG. 1, the second datum D<2> may include a plurality of bits.

The error correction circuit 10 may generate a first error code EC<1> including error information on the first datum D<1> in response to the command/address signal CA during a write operation. The error correction circuit 10 may generate a second error code EC<2> including error information on the second datum D<2> in response to the command/address signal CA during the write operation. The error correction circuit 10 may compare the first error code EC<1> with the second error code EC<2> to generate the comparison signal CMP in response to the command/address signal CA during a read operation. The error correction circuit 10 may generate the comparison signal CMP which is enabled if the first error code EC<1> and the second error code EC<2> have the same logic level combination, in response to the command/address signal CA during the read operation. The error correction circuit 10 may correct an error of the first datum D<1> according to the first error code EC<1>, in response to the command/address signal CA during the read operation. The error correction circuit 10 may correct an error of the second datum D<2> according to the second error code EC<2>, in response to the command/address signal CA during the read operation. The second error code EC<2> may be outputted after the first error code EC<1> is outputted. The number of bits included in the first error code EC<1> may be less than the number of bits included in the first datum D<1>. The number of bits included in the second error code EC<2> may be less than the number of bits included in the second datum D<2>. The first datum D<1> and the second datum D<2> may have different logic level combinations if the first error code EC<1> and the second error code EC<2> have different logic level combinations.

The first bank 20 may include a first memory area 21 and a first error code area 22. The first memory area 21 may include a plurality of memory cells and may store the first datum D<1> into memory cells selected in response to the command/address signal CA during the write operation. The first memory area 21 may output the first datum D<1> stored in the memory cells selected in response to the command/address signal CA during the read operation. The first error code area 22 may store the first error code EC<1> including the error information on the first datum D<1>, in response to the command/address signal CA during the write operation. The first error code area 22 may output the first error code EC<1> including the error information on the first datum D<1>, in response to the command/address signal CA during the read operation.

The second bank 30 may include a second memory area 31 and a second error code area 32. The second memory area 31 may include a plurality of memory cells and may store the second datum D<2> into memory cells selected in response to the command/address signal CA during the write operation. The second memory area 31 may output the second datum D<2> stored in the memory cells selected in response to the command/address signal CA during the read operation. The second error code area 32 may store the second error code EC<2> including the error information on the second datum D<2>, in response to the command/address signal CA during the write operation. The second error code area 32 may output the second error code EC<2> including the error information on the second datum D<2>, in response to the command/address signal CA during the read operation.

Although FIG. 1 illustrates an example in which the second semiconductor device 2 includes the first and second banks 20 and 30, the second semiconductor device 2 may be realized to include three or more banks according to the various embodiments.

Figure 2:
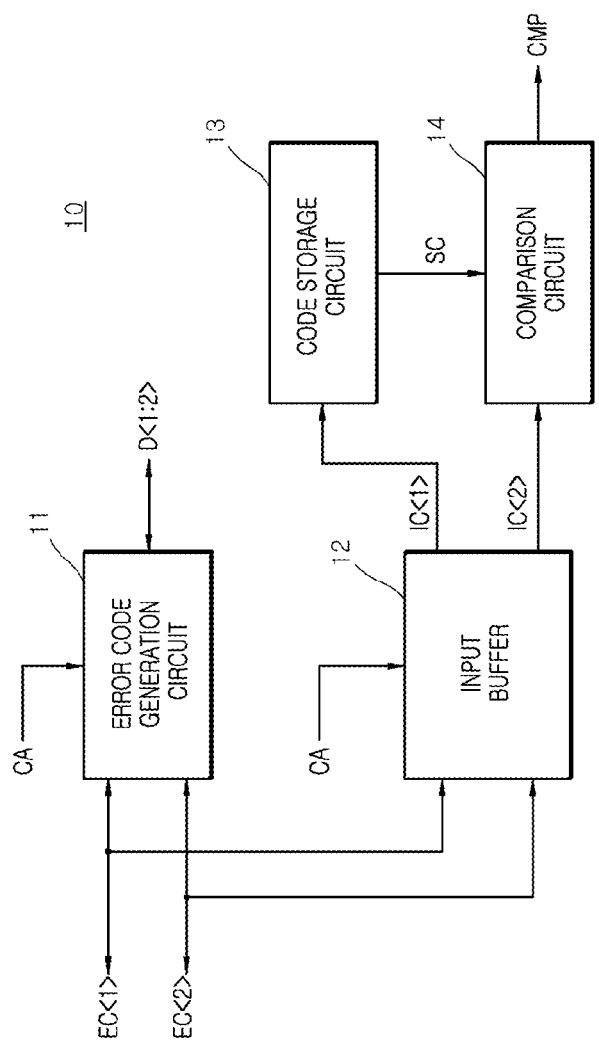
FIG. 2 is a block diagram illustrating a configuration of an error correction circuit included in the semiconductor system of FIG. 1.

Referring to FIG. 2, the error correction circuit 10 may include an error code generation circuit 11, an input buffer 12, a code storage circuit 13 and a comparison circuit 14.

The error code generation circuit 11 may generate the first error code EC<1> including the error information on the first datum D<1> in response to the command/address signal CA during the write operation. The error code generation circuit 11 may generate the second error code EC<2> including the error information on the second datum D<2> in response to the command/address signal CA during the write operation.

The error code generation circuit 11 may correct an error of the first datum D<1> according to the first error code EC<1> in response to the command/address signal CA during the read operation. The error code generation circuit 11 may correct an error of the second datum D<2> according to the second error code EC<2> in response to the command/address signal CA during the read operation. The error code generation circuit 11 may be realized using a circuit that corrects errors of data with a general error correction code (ECC) scheme.

The input buffer 12 may buffer the first error code EC<1> to generate a first internal error code IC<1> in response to the command/address signal CA during the read operation. The input buffer 12 may buffer the second error code EC<2> to generate a second internal error code IC<2> in response to the command/address signal CA during the read operation.

The code storage circuit 13 may store the first internal error code IC<1> and may output the stored first internal error code as a storage error code SC. The code storage circuit 13 may output the stored first internal error code as the storage error code SC at a point of time that the second internal error code IC<2> is generated. Although FIG. 2 illustrates an example in which the code storage circuit 13 stores the first internal error code IC<1>, the code storage circuit 13 may be realized using a register that stores a plurality of signals according to the embodiments.

The comparison circuit 14 may compare the storage error code SC with the second internal error code IC<2> to generate the comparison signal CMP. The comparison circuit 14 may generate the comparison signal CMP which is enabled if the storage error code SC and the second internal error code IC<2> have the same logic level combination. A logic level of the enabled comparison signal CMP may be set to be different according to the embodiments.

An operation of detecting the identity between data of a semiconductor system having an aforementioned configuration will be described hereinafter in conjunction with an example in which the first datum D<1> and the second datum D<2> have different logic level combinations and an example in which the first datum D<1> and the second datum D<2> have the same logic level combination. In an embodiment, detecting the identity between data of a semiconductor system may mean detecting whether a logic level combination between a datum is equal to or not equal to a logic level combination of other datum.

First, the operation of detecting the identity between the data of the semiconductor system will be described hereinafter in conjunction with an example in which the first datum D<1> and the second datum D<2> have different logic level combinations.

The first semiconductor device 1 may output the command/address signal CA for the write operation, the first datum D<1> and the second datum D<2>. In such a case, the first datum D<1> and the second datum D<2> may have different logic level combinations.

The error correction circuit 10 may generate the first error code EC<1> including the error information on the first datum D<1> in response to the command/address signal CA. The error correction circuit 10 may generate the second error code EC<2> including the error information on the second datum D<2> in response to the command/address signal CA. Since the first datum D<1> and the second datum D<2> have different logic level combinations, the first error code EC<1> and the second error code EC<2> may also be generated to have different logic level combinations.

The first memory area 21 of the first bank 20 may store the first datum D<1> into memory cells selected in response to the command/address signal CA. The first error code area 22 of the first bank 20 may store the first error code EC<1> in response to the command/address signal CA.

The second memory area 31 of the second bank 30 may store the second datum D<2> into memory cells selected in response to the command/address signal CA. The second error code area 32 of the second bank 30 may store the second error code EC<2> in response to the command/address signal CA.

The first semiconductor device 1 may output the command/address signal CA for the read operation.

The first memory area 21 of the first bank 20 may output the first datum D<1> of the memory cells selected in response to the command/address signal CA. The first error code area 22 of the first bank 20 may output the first error code EC<1> including the error information on the first datum D<1> in response to the command/address signal CA.

The second memory area 31 of the second bank 30 may output the second datum D<2> of the memory cells selected in response to the command/address signal CA. The second error code area 32 of the second bank 30 may output the second error code EC<2> including the error information on the second datum D<2> in response to the command/address signal CA.

The error correction circuit 10 may generate the comparison signal CMP which is disabled in response to the command/address signal CA, because the first error code EC<1> and the second error code EC<2> have different logic level combinations.

The first semiconductor device 1 may receive the disabled comparison signal CMP to detect that the first datum D<1> and the second datum D<2> have different logic level combinations.

Next, the operation of detecting the identity between the data of the semiconductor system will be described hereinafter in conjunction with an example in which the first datum D<1> and the second datum D<2> have the same logic level combination.

The first semiconductor device 1 may output the command/address signal CA for the write operation, the first datum D<1> and the second datum D<2>. In such a case, the first datum D<1> and the second datum D<2> may have the same logic level combination.

The error correction circuit 10 may generate the first error code EC<1> including the error information on the first datum D<1> in response to the command/address signal CA. The error correction circuit 10 may generate the second error code EC<2> including the error information on the second datum D<2> in response to the command/address signal CA. Since the first datum D<1> and the second datum D<2> have the same logic level combination, the first error code EC<1> and the second error code EC<2> may also be generated to have the same logic level combination.

The first memory area 21 of the first bank 20 may store the first datum D<1> into memory cells selected in response to the command/address signal CA. The first error code area 22 of the first bank 20 may store the first error code EC<1> in response to the command/address signal CA.

The second memory area 31 of the second bank 30 may store the second datum D<2> into memory cells selected in response to the command/address signal CA. The second error code area 32 of the second bank 30 may store the second error code EC<2> in response to the command/address signal CA.

The first semiconductor device 1 may output the command/address signal CA for the read operation.

The first memory area 21 of the first bank 20 may output the first datum D<1> of the memory cells selected in response to the command/address signal CA. The first error code area 22 of the first bank 20 may output the first error code EC<1> including the error information on the first datum D<1> in response to the command/address signal CA.

The second memory area 31 of the second bank 30 may output the second datum D<2> of the memory cells selected in response to the command/address signal CA. The second error code area 32 of the second bank 30 may output the second error code EC<2> including the error information on the second datum D<2> in response to the command/address signal CA.

The error correction circuit 10 may generate the comparison signal CMP which is enabled in response to the command/address signal CA, because the first error code EC<1> and the second error code EC<2> have the same logic level combination.

The first semiconductor device 1 may receive the enabled comparison signal CMP to detect that the first datum D<1> and the second datum D<2> have the same logic level combination.

As described above, a semiconductor system according to an embodiment may compare error codes including error information on data to detect the identity between the data. As described above, in an embodiment, a semiconductor system according to an embodiment may compare error codes including error information on data to detect whether the logic level combinations between the data are equal to or not equal to one another. In addition, since the semiconductor system detects the identity between the data by comparing the error codes having the number of bits which is less than the number of bits included in the data, a time for detecting the identity between the data and an amount of current required for detection of the identity between the data may be reduced.

Figure 3:
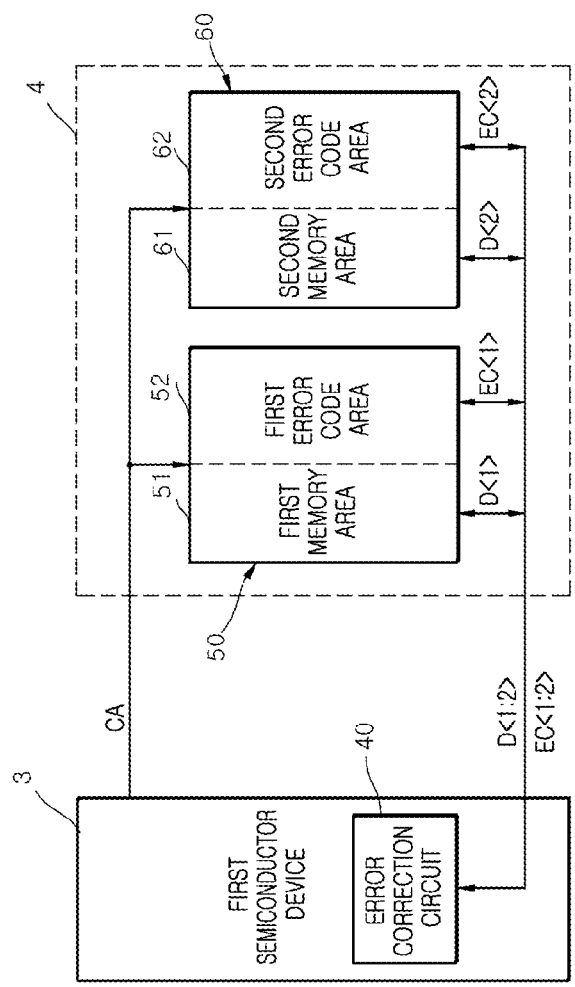
FIG. 3 is a block diagram illustrating a configuration of a semiconductor system according to an embodiment.

Referring to FIG. 3, a semiconductor system according to an embodiment may include a first semiconductor device 3 and a second semiconductor device 4. The first semiconductor device 3 may include an error correction circuit 40. The second semiconductor device 4 may include a first bank 50 and a second bank 60.

The first semiconductor device 3 may output a command/address signal CA, a first datum D<1> and a second datum D<2> (i.e., D<1:2>). The first semiconductor device 3 may receive a first error code EC<1> and a second error code EC<2> (i.e., EC<1:2>) to detect identity between the first datum D<1> and the second datum D<2>. In an embodiment, for example, detecting an identity between the first datum D<1> and the second datum D<2> may mean detecting whether the logic level combination of the first datum D<1> is equal to or not equal to the logic level combination of the second datum D<2>. The command/address signal CA may be transmitted through a signal line that transmits at least one of an address, a command and data. The command/address signal CA may include a plurality of bits. One or more bits among the plurality of bits included in the command/address signal CA may include a command for controlling an operation of the second semiconductor device 4. One or more bits among the plurality of bits included in the command/address signal CA may include an address for selecting memory cells included in the first bank 50 and the second bank 60 of the second semiconductor device 4. Although the first datum D<1> is illustrated as a single signal line in FIG. 3, the first datum D<1> may include a plurality of bits. Similarly, although the second datum D<2> is illustrated as a single signal line in FIG. 3, the second datum D<2> may include a plurality of bits.

The error correction circuit 40 may generate the first error code EC<1> including error information on the first datum D<1> in response to the command/address signal CA during a write operation. The error correction circuit 40 may output and apply the first error code EC<1> to the second semiconductor device 4 during the write operation. The error correction circuit 40 may generate the second error code EC<2> including error information on the second datum D<2> in response to the command/address signal CA during the write operation. The error correction circuit 40 may output and apply the second error code EC<2> to the second semiconductor device 4 during the write operation. The error correction circuit 40 may receive the first and second error code EC<1> and EC<2> from the second semiconductor device 4 during a read operation. The error correction circuit 40 may compare the first error code EC<1> with the second error code EC<2> to detect the identity between the first datum D<1> and the second datum D<2> during the read operation. The error correction circuit 40 may correct an error of the first datum D<1> according to the first error code EC<1> during the read operation. The error correction circuit 40 may correct an error of the second datum D<2> according to the second error code EC<2> during the read operation. The number of bits included in the first error code EC<1> may be less than the number of bits included in the first datum D<1>. The number of bits included in the second error code EC<2> may be less than the number of bits included in the second datum D<2>. The first datum D<1> and the second datum D<2> may have different logic level combinations if the first error code EC<1> and the second error code EC<2> have different logic level combinations. The error correction circuit 40 may be realized to have the same configuration as the error correction circuit 10 described with reference to FIGS. 1 and 2. Thus, a detailed description of the error correction circuit 40 will be omitted hereinafter to avoid duplicate explanation.

The first bank 50 may include a first memory area 51 and a first error code area 52. The first memory area 51 may include a plurality of memory cells and may store the first datum D<1> into memory cells selected in response to the command/address signal CA during the write operation. The first memory area 51 may output the first datum D<1> stored in the memory cells selected in response to the command/address signal CA during the read operation. The first error code area 52 may store the first error code EC<1> including the error information on the first datum D<1>, in response to the command/address signal CA during the write operation. The first error code area 52 may output the first error code EC<1> including the error information on the first datum D<1>, in response to the command/address signal CA during the read operation.

The second bank 60 may include a second memory area 61 and a second error code area 62. The second memory area 61 may include a plurality of memory cells and may store the second datum D<2> into memory cells selected in response to the command/address signal CA during the write operation. The second memory area 61 may output the second datum D<2> stored in the memory cells selected in response to the command/address signal CA during the read operation. The second error code area 62 may store the second error code EC<2> including the error information on the second datum D<2>, in response to the command/address signal CA during the write operation. The second error code area 62 may output the second error code EC<2> including the error information on the second datum D<2>, in response to the command/address signal CA during the read operation. The second error code EC<2> may be outputted after the first error code EC<1> is outputted.

Although FIG. 3 illustrates an example in which the second semiconductor device 4 includes the first and second banks 50 and 60, the second semiconductor device 4 may be realized to include three or more banks according to the various embodiments.

As described above, a semiconductor system according to an embodiment may compare error codes including error information on data to detect the identity between the data. In addition, since the semiconductor system detects the identity between the data by comparing the error codes having the number of bits which is less than the number of bits included in the data, a time for detecting the identity between the data and an amount of current required for detection of the identity between the data may be reduced.

Figure 4:
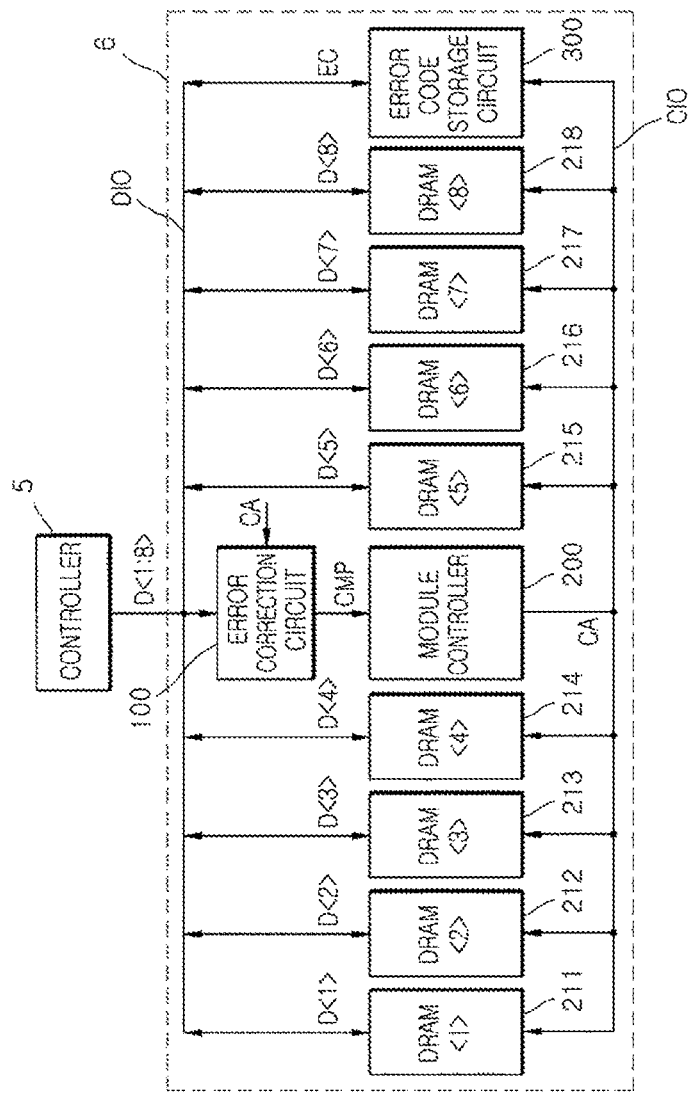
FIG. 4 is a block diagram illustrating a configuration of a semiconductor system according to an embodiment.

Referring to FIG. 4, a semiconductor system according to an embodiment may include a controller 5 and a semiconductor module 6. The semiconductor module 6 may include an error correction circuit 100, a module controller 200, first to eighth semiconductor devices 211~218, and an error code storage circuit 300.

The controller 5 may output first to eighth data D<1:8> through a data line DIO during a write operation. The controller 5 may receive the first to eighth data D<1:8> loaded on the data line DIO during a read operation. The data line DIO may be realized using an input and output (input/output) (I/O) bus including a plurality of signal lines.

The error correction circuit 100 may generate an error code EC including error information on the first to eighth data D<1:8> in response to a command/address signal CA during the write operation. The error correction circuit 100 may output the error code EC through the data line DIO in response to the command/address signal CA during the write operation. The error correction circuit 100 may generate a comparison signal CMP according to the error information included in the error code EC loaded on the data line DIO in response to the command/address signal CA during the read operation. The error correction circuit 100 may correct errors of the first to eighth data D<1:8> according to the error code EC in response to the command/address signal CA during the read operation. The error correction circuit 100 may output the corrected first to eighth data through the data line DIO. The error code EC may be set to have a plurality of bits including the error information on the first to eighth data D<1:8>.

An operation of the error correction circuit 100 for generating the comparison signal CMP will be described hereinafter.

The error correction circuit 100 may compare the error code EC including the error information on the first datum D<1> with the error code EC including the error information on the second datum D<2> to generate the comparison signal CMP, in order to discriminate whether the first datum D<1> is identical to the second datum D<2>. In addition, the error correction circuit 100 may compare the error codes EC including the error information on the first, third and fifth data D<1>, D<3> and D<5> to generate the comparison signal CMP, in order to discriminate the identity between the first, third and fifth data D<1>, D<3> and D<5>. That is, the error correction circuit 100 may compare the error codes EC to generate the comparison signal CMP exhibiting the identity or the nonidentity between a plurality of data, for example, the first to eighth data D<1:8>. In an embodiment, for example, the error correction circuit 100 may compare the error codes EC including the error information on the first, third and fifth data D<1>, D<3> and D<5> to generate the comparison signal CMP, in order to discriminate the logic level combinations between the first, third and fifth data D<1>, D<3> and D<5>. That is, for example, in an embodiment, the error correction circuit 100 may compare the error codes EC to generate the comparison signal CMP exhibiting whether or not the logic level combinations are equal or not to one another between a plurality of data, for example, the first to eighth data D<1:8>.

The module controller 200 may output the command/address signal CA through a command line CIO. The module controller 200 may receive the comparison signal CMP to detect the identity between the first to eighth data D<1:8>. The module controller 200 may receive the comparison signal CMP to detect the identity between some data among the first to eighth data D<1:8>. In an embodiment, for example, the module controller 200 may receive the comparison signal CMP to detect whether the logic level combinations are equal or not equal to one another between some data among the first to eighth data D<1:8>. The command/address signal CA may include a plurality of bits. One or more bits among the plurality of bits included in the command/address signal CA may include a command for controlling an operation of the first to eighth semiconductor devices 211~218. One or more bits among the plurality of bits included in the command/address signal CA may include an address for selecting memory cells included in the first to eighth semiconductor devices 211~218.

The first semiconductor device 211 may include a plurality of memory cells and may store the first datum D<1> loaded on the data line DIO into memory cells selected in response to the command/address signal CA during the write operation. The first semiconductor device 211 may output the first datum D<1> stored in the memory cells selected in response to the command/address signal CA, through the data line DIO during the read operation.

The second semiconductor device 212 may include a plurality of memory cells and may store the second datum D<2> loaded on the data line DIO into memory cells selected in response to the command/address signal CA during the write operation. The second semiconductor device 212 may output the second datum D<2> stored in the memory cells selected in response to the command/address signal CA, through the data line DIO during the read operation.

The third semiconductor device 213 may include a plurality of memory cells and may store the third datum D<3> loaded on the data line DIO into memory cells selected in response to the command/address signal CA during the write operation. The third semiconductor device 213 may output the third datum D<3> stored in the memory cells selected in response to the command/address signal CA, through the data line DIO during the read operation.

The fourth semiconductor device 214 may include a plurality of memory cells and may store the fourth datum D<4> loaded on the data line DIO into memory cells selected in response to the command/address signal CA during the write operation. The fourth semiconductor device 214 may output the fourth datum D<4> stored in the memory cells selected in response to the command/address signal CA, through the data line DIO during the read operation.

The fifth semiconductor device 215 may include a plurality of memory cells and may store the fifth datum D<5> loaded on the data line DIO into memory cells selected in response to the command/address signal CA during the write operation. The fifth semiconductor device 215 may output the fifth datum D<5> stored in the memory cells selected in response to the command/address signal CA, through the data line DIO during the read operation.

The sixth semiconductor device 216 may include a plurality of memory cells and may store the sixth datum D<6> loaded on the data line DIO into memory cells selected in response to the command/address signal CA during the write operation. The sixth semiconductor device 216 may output the sixth datum D<6> stored in the memory cells selected in response to the command/address signal CA, through the data line DIO during the read operation.

The seventh semiconductor device 217 may include a plurality of memory cells and may store the seventh datum D<7> loaded on the data line DIO into memory cells selected in response to the command/address signal CA during the write operation. The seventh semiconductor device 217 may output the seventh datum D<7> stored in the memory cells selected in response to the command/address signal CA, through the data line DIO during the read operation.

The eighth semiconductor device 218 may include a plurality of memory cells and may store the eighth datum D<8> loaded on the data line DIO into memory cells selected in response to the command/address signal CA during the write operation. The eighth semiconductor device 218 may output the eighth datum D<8> stored in the memory cells selected in response to the command/address signal CA, through the data line DIO during the read operation.

The first to eighth semiconductor devices 211~218 may be realized using general volatile memory devices such as, for example but not limited to, dynamic random access memory (DRAM) devices or general nonvolatile memory devices such as, for example but not limited to, flash memory devices.

The error code storage circuit 300 may store the error codes EC loaded on the data line DIO, in response to the command/address signal CA during the write operation. The error code storage circuit 300 may output the error codes EC through the data line DIO, in response to the command/address signal CA during the read operation.

As described above, a semiconductor system according to an embodiment may compare error codes including error information on data to detect the identity between the data or, for example, in an embodiment, to detect whether the logic level combinations between the data are equal or not equal to one another. In addition, since the semiconductor system detects the identity or for example whether the logic level combinations are equal or not to one another between the data by comparing the error codes having the number of bits which is less than the number of bits included in the data, a time for detecting the identity, or for example whether the logic level combinations are equal, between the data and an amount of current required for detection of the identity, or for example whether the logic level combinations are equal, between the data may be reduced.

Figure 5:
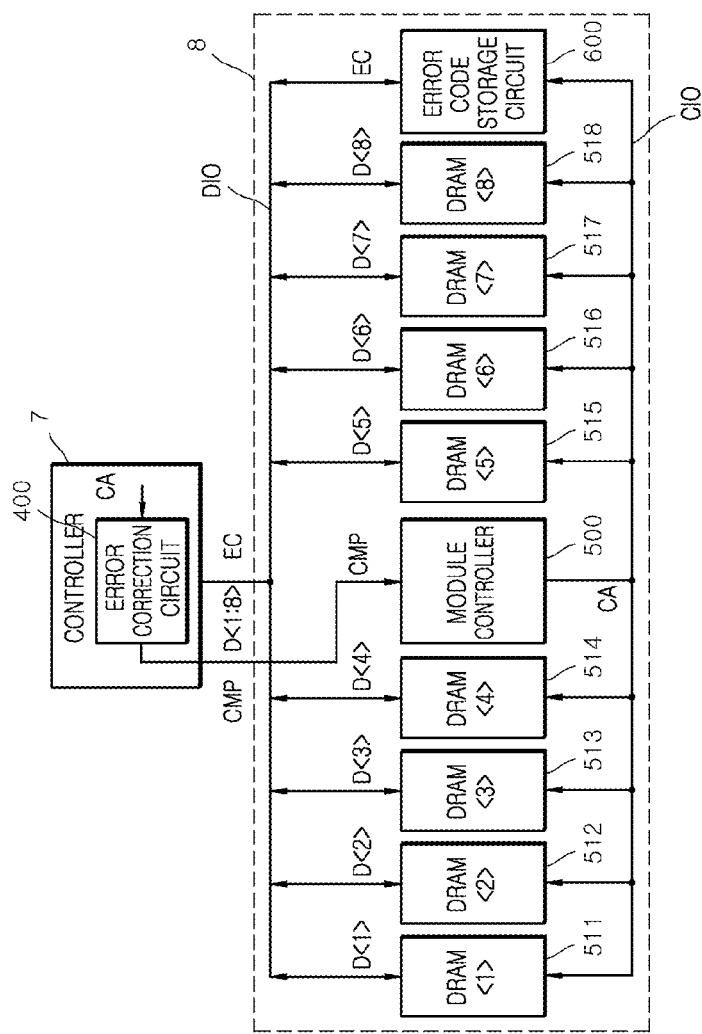
FIG. 5 is a block diagram illustrating a configuration of a semiconductor system according to an embodiment.

Referring to FIG. 5, a semiconductor system according to an embodiment may include a controller 7 and a semiconductor module 8. The controller 7 may include an error correction circuit 400. The semiconductor module 8 may include a module controller 500, first to eighth semiconductor devices 511~518, and an error code storage circuit 600.

The controller 7 may output first to eighth data D<1:8> through a data line DIO during a write operation. The controller 7 may receive the first to eighth data D<1:8> loaded on the data line DIO during a read operation. The data line DIO may be realized using an input/output (I/O) bus including a plurality of signal lines.

The error correction circuit 400 may generate an error code EC including error information on the first to eighth data D<1:8> in response to a command/address signal CA during the write operation. The error correction circuit 400 may output the error codes EC through the data line DIO in response to the command/address signal CA during the write operation. The error correction circuit 400 may generate a comparison signal CMP according to the error information included in the error code EC loaded on the data line DIO in response to the command/address signal CA during the read operation. The error correction circuit 400 may correct errors of the first to eighth data D<1:8> according to the error code EC in response to the command/address signal CA during the read operation. The error correction circuit 400 may output the corrected first to eighth data through the data line DIO. The error code EC may be set to have a plurality of bits including the error information on the first to eighth data D<1:8>.

The error correction circuit 400 illustrated in FIG. 5 may be realized to have the same configuration as the error correction circuit 100 described with reference to FIG. 4 and to perform the same operation as the error correction circuit 100 described with reference to FIG. 4. The only deference between the error correction circuits 100 and 400 is that the error correction circuit 400 is included in the controller 7 whereas the error correction circuit 100 is excluded from the controller 5 corresponding to the controller 7. Thus, a detailed description of the error correction circuit 400 will be omitted hereinafter.

The module controller 500 may output the command/address signal CA through a command line CIO. The module controller 500 may receive the comparison signal CMP to detect the identity between the first to eighth data D<1:8>. In an embodiment, for example, the module controller 500 may receive the comparison signal CMP to detect whether the logic level combinations are equal or not equal to one another between the first to eighth data D<1:8>. The module controller 500 may receive the comparison signal CMP to detect the identity between some data among the first to eighth data D<1:8>. In an embodiment, for example, the module controller 500 may receive the comparison signal CMP to detect whether the logic level combinations are equal or not equal to one another between some data among the first to eighth data D<1:8>. The command/address signal CA may include a plurality of bits. One or more bits among the plurality of bits included in the command/address signal CA may include a command for controlling an operation of the first to eighth semiconductor devices 511~518.

One or more bits among the plurality of bits included in the command/address signal CA may include an address for selecting memory cells included in the first to eighth semiconductor devices 511~518.

The first to eighth semiconductor devices 511~518 may be realized to have the same configuration as the first to eighth semiconductor devices 211~218 described with reference to FIG. 4 and to perform the same operation as the first to eighth semiconductor devices 211~218 described with reference to FIG. 4. Thus, a detailed description of the first to eighth semiconductor devices 511~518 will be omitted hereinafter. In addition, the first to eighth semiconductor devices 511~518 may be realized using general volatile memory devices such as, for example but not limited to, dynamic random access memory (DRAM) devices or general nonvolatile memory devices such as, for example but not limited to, flash memory devices.

The error code storage circuit 600 may be realized to have the same configuration as the error code storage circuit 300 described with reference to FIG. 4 and to perform the same operation as the error code storage circuit 300 described with reference to FIG. 4. Thus, a detailed description of the error code storage circuit 600 will be omitted hereinafter.

As described above, a semiconductor system according to an embodiment may compare error codes including error information on data to detect the identity between the data or, for example, in an embodiment, to detect whether the logic level combinations between the data are equal or not equal to one another. In addition, since the semiconductor system detects the identity or for example whether the logic level combinations are equal or not to one another between the data by comparing the error codes having the number of bits which is less than the number of bits included in the data, a time for detecting the identity, or for example whether the logic level combinations are equal, between the data and an amount of current required for detection of the identity, or for example whether the logic level combinations are equal, between the data may be reduced.

The semiconductor devices or the semiconductor systems described with reference to FIGS. 1 to 5 may be applied to an electronic system that includes a memory system, a graphic system, a computing system, a mobile system, or the like. For example, referring to FIG. 6, an electronic system 1000 according an embodiment may include a data storage circuit 1001, a memory controller 1002, a buffer memory 1003, and an input and output (input/output) (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include, for example but not limited to, the second semiconductor device 2 illustrated in FIG. 1, the second semiconductor device 4 illustrated in FIG. 3, the first to eighth semiconductor devices 211~218 illustrated in FIG. 4, or the first to eighth semiconductor devices 511~518 illustrated in FIG. 5. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

Figure 6:
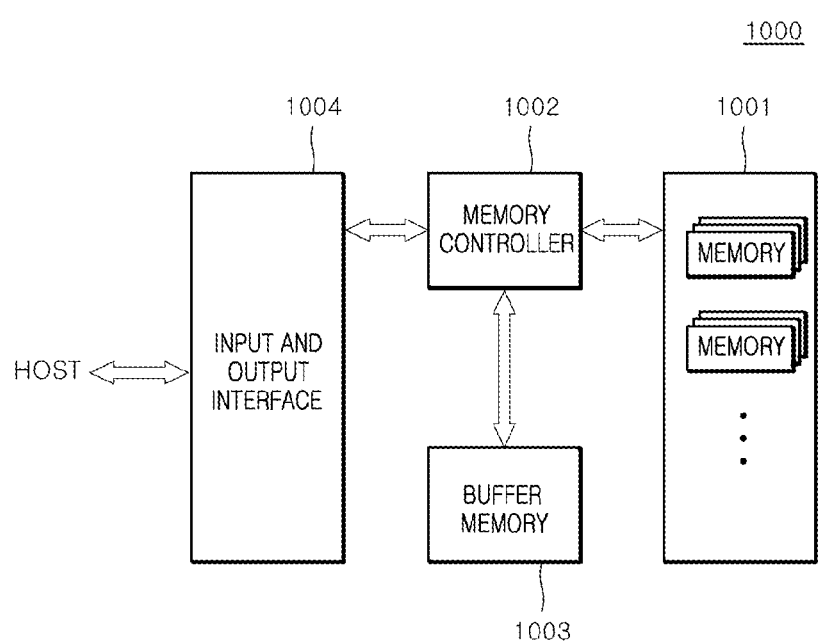
FIG. 6 is a block diagram illustrating a configuration of an electronic system employing semiconductor devices or the semiconductor systems described with reference to FIGS. 1 to 5.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include, for example but not limited to, the first semiconductor device 1 illustrated in FIG. 1, the first semiconductor device 3 illustrated in FIG. 3, the module controller 200 illustrated in FIG. 4, or the module controller 500 illustrated in FIG. 5. Although FIG. 6 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 7:
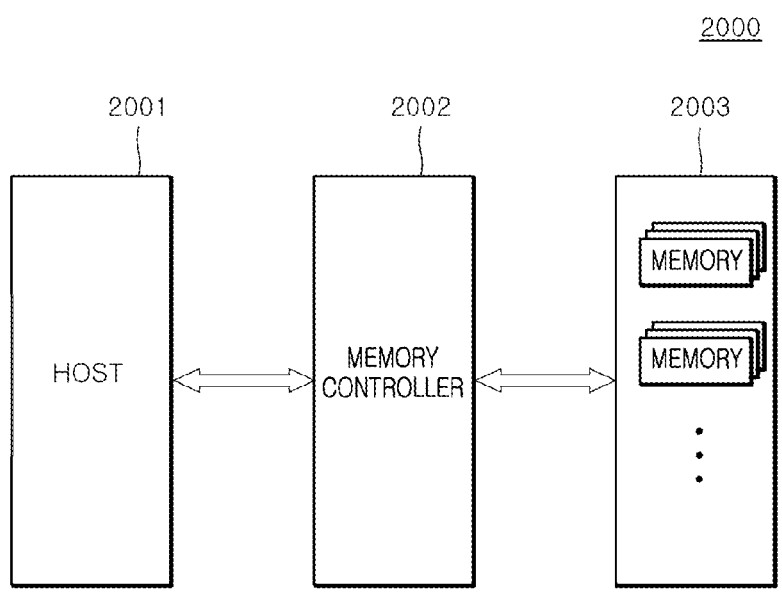
FIG. 7 is a block diagram illustrating a configuration of an electronic system employing semiconductor devices or the semiconductor systems described with reference to FIGS. 1 to 5.

Referring to FIG. 7, an electronic system 2000 according to an embodiment may include a host 2001, a memory controller 2002 and a data storage circuit 2003.

The host 2001 may output a request signal and data to the memory controller 2002 to access the data storage circuit 2003. The memory controller 2002 may supply the data, a data strobe signal, a command, addresses and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the addresses and the clock signal to the data storage circuit 2003 in order to control operations of the data storage circuit 2003. In addition, the memory controller 2002 may supply the data outputted from the data storage circuit 2003 to the host 2001. The memory controller 2002 may include, for example but not limited to, the first semiconductor device 1 of FIG. 1, the first semiconductor device 3 illustrated in FIG. 3, the module controller 200 illustrated in FIG. 4, or the module controller 500 illustrated in FIG. 5.

The data storage circuit 2003 may include a plurality of memories. The data storage circuit 2003 may receive the data, the data strobe signal, the command, the addresses and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include, for example but not limited to, the second semiconductor device 2 illustrated in FIG. 1, the second semiconductor device 4 illustrated in FIG. 3, the first to eighth semiconductor devices 211~218 illustrated in FIG. 4, or the first to eighth semiconductor devices 511~518 illustrated in FIG. 5.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

What is claimed is:

1. A semiconductor system comprising:
   a first semiconductor device configured to output a command/address signal, a first datum and a second datum and configured to receive a comparison signal to detect whether logic level combinations between the first datum and the second datum are equal;
   an error correction circuit configured to generate a first error code and a second error code during a write operation and configured to compare the first error code with the second error code to generate the comparison signal during a read operation;
   a first bank configured to store the first datum into a first memory area of the first bank during the write operation, configured to store the first error code into a first error code area of the first bank during the write operation, and configured to output the first datum and the first error code during the read operation; and
   a second bank configured to store the second datum into a second memory area of the second bank during the write operation, configured to store the second error code into a second error code area of the second bank during the write operation, and configured to output the second datum and the second error code during the read operation.

2. The semiconductor system of claim 1,
   wherein the first error code includes error information on the first datum; and
   wherein the second error code includes error information on the second datum.

3. The semiconductor system of claim 1, wherein the first datum and the second datum have different logic level combinations if the first error code and the second error code have different logic level combinations.

4. The semiconductor system of claim 1, wherein the second error code is outputted after the first error code is outputted.

5. The semiconductor system of claim 1, wherein the error correction circuit includes:
   an error code generation circuit configured to generate the first error code including error information on the first datum and the second error code including error information on the second datum during the write operation;
   an input buffer configured to buffer the first and second error codes to generate a first internal error code and a second internal error code during the read operation;
   a code storage circuit configured to store the first internal error code and configure to output the stored first internal error code as a storage error code; and
   a comparison circuit configured to compare the storage error code with the second internal error code to generate the comparison signal.

6. The semiconductor system of claim 5, wherein the error code generation circuit is configured to correct errors of the first and second data according to the first and second error codes and configured to output the corrected first and second data, during the read operation.

7. A semiconductor system comprising:
   a first semiconductor device configured to output a command/address signal, configured to receive or output a first datum and a second datum, and configured to compare a first error code with a second error code to detect whether logic level combinations between the first datum and the second datum are equal;
   a first bank configured to store the first datum into a first memory area of the first bank based on the command/address signal during a write operation, configured to store the first error code into a first error code area of the first bank based on the command/address signal during the write operation, and configured to output the first datum and the first error code based on the command/address signal during a read operation; and
   a second bank configured to store the second datum into a second memory area of the second bank based on the command/address signal during the write operation, configured to store the second error code into a second error code area of the second bank based on the command/address signal during the write operation, and configured to output the second datum and the second error code based on the command/address signal during the read operation.

8. The semiconductor system of claim 7,
   wherein the first error code includes error information on the first datum; and
   wherein the second error code includes error information on the second datum.

9. The semiconductor system of claim 7, wherein the first datum and the second datum have different logic level combinations if the first error code and the second error code have different logic level combinations.

10. The semiconductor system of claim 7, wherein the second error code is outputted after the first error code is outputted.

11. The semiconductor system of claim 7, wherein the first semiconductor device includes an error correction circuit configured to generate the first error code and the second error code during the write operation and configured to compare the first error code with the second error code to detect whether the logic level combination between the first datum and the second datum are equal during the read operation.

12. A semiconductor device comprising:
   an error correction circuit configured to generate a first error code of a first datum and a second error code of a second datum based on a command/address signal during a write operation and configured to compare the first error code with the second error code to generate a comparison signal based on a command/address signal during the read operation; and
   a bank configured to store the first and second data into a memory area of the bank during the write operation, configured to store the first and second error codes into an error code area of the bank during the write operation, and configured to output the first and second data as well as the first and second error codes during the read operation.

13. The semiconductor device of claim 12,
   wherein the first error code includes error information on the first datum; and
   wherein the second error code includes error information on the second datum.

14. The semiconductor device of claim 12, wherein the first datum and the second datum have different logic level combinations if the first error code and the second error code have different logic level combinations.

15. The semiconductor device of claim 12, wherein the second error code is outputted after the first error code is outputted.

16. The semiconductor device of claim 12, wherein the error correction circuit compares the first error code with the second error code to detect whether logic level combinations between the first datum and the second datum are equal during the read operation.

17. A semiconductor system comprising:
   a controller configured to receive or output data through a data line; and
   a semiconductor module configured to include a plurality of semiconductor devices and an error code storage circuit, configured to store the data into a first bank of each of the plurality of semiconductor devices during a write operation, configured to store a plurality of error codes including a plurality of error information on the data into a second bank of the error code storage circuit during the write operation, and configured to selectively select and compare a subset of the plurality of error codes to detect whether logic level combinations between the data are equal to one another during a read operation.

18. A semiconductor system comprising:
   a controller configured to receive or output data through a data line and configured to selectively select and compare a subset of a plurality of error codes loaded on the data line to generate a comparison signal; and
   a semiconductor module configured to include a plurality of semiconductor devices and an error code storage circuit, configured to store the data into a first bank of each of the plurality of semiconductor devices during a write operation, configured to store the plurality of error codes including a plurality of error information on the data into a second bank of the error code storage circuit during the write operation, and configured to output the error codes through the data line during a read operation,
   wherein the semiconductor module detects whether logic level combinations between the data are equal to one another based on the comparison signal during the read operation.

* * * * *